United States Patent [19]
Pritchard

[11] Patent Number: 5,805,713
[45] Date of Patent: Sep. 8, 1998

[54] SOLID STATE CIRCUIT FOR EMULATING PUSH-PULL TUBE AMPLIFIER

[76] Inventor: Eric K. Pritchard, Rte. 1, Box 536, Berkeley Springs, W. Va. 25411

[21] Appl. No.: 761,964

[22] Filed: Dec. 10, 1996

Related U.S. Application Data

[63] Continuation-in-part of Ser. No. 394,303, Feb. 24, 1995, which is a continuation-in-part of Ser. No. 202,369, Feb. 25, 1994, which is a continuation-in-part of Ser. No. 914,596, Jul. 20, 1992, Pat. No. 5,434,536.

[51] Int. Cl.[6] .................................................. H03G 3/00
[52] U.S. Cl. ............................................ 381/61; 330/262
[58] Field of Search .............................. 381/61, 118, 120; 330/262, 264, 265

[56] References Cited

U.S. PATENT DOCUMENTS

| | | |
|---|---|---|
| 3,835,409 | 9/1974 | Laub . |
| 3,968,382 | 7/1976 | Tsurushima . |
| 4,041,408 | 8/1977 | Trotnick, Jr. . |
| 4,330,754 | 5/1982 | Hartley . |
| 4,405,832 | 9/1983 | Sondermeyer . |
| 4,439,742 | 3/1984 | Sondermeyer . |
| 4,811,401 | 3/1989 | Brown, Sr. et al. . |
| 4,937,847 | 6/1990 | Kruger . |
| 4,987,381 | 1/1991 | Butler . |
| 5,524,055 | 6/1996 | Sondermeyer . |

*Primary Examiner*—Forester W. Isen
*Attorney, Agent, or Firm*—Barnes & Thornburg

[57] ABSTRACT

A solid state emulation of vacuum tube amplifiers and more particularly to the emulation of push-pull output stages. This application focuses on the emulation of grid conduction by the output tubes and their non-linear transconductance.

34 Claims, 4 Drawing Sheets

SOLID STATE CIRCUIT FOR EMULATING PUSH-PULL TUBE AMPLIFIER

CROSS REFERENCE

This is a continuation-in-part of U.S. application Ser. No. 08/394,303 filed Feb. 24, 1995, which is a continuation-in-part of U.S. application Ser. No. 08/202,369 filed Feb. 25, 1994, which is a continuation-in-part of U.S. application Ser. No. 07/914,596 filed Jul. 20, 1992 and is now U.S. Pat. No. 5,434,536 issued Jul. 18, 1995.

This invention relates to the emulation of vacuum tube audio amplifiers by solid state means and more specifically to the emulation of push-pull output stages. This application focuses on the emulation of grid conduction, the non-linear transconductance, and the basic structure of the emulation circuitry.

BACKGROUND AND SUMMARY OF THE INVENTION

There have been many emulations of vacuum tube audio amplifiers by solid state circuitry over the years. Of these, there are two that relate to the emulation of the vacuum tube power stage, Hartley, U.S. Pat. No. 4,330,754, and Sondermeyer, U.S. Pat. No. 4,439,742. The circuit in U.S. Pat. No. 4,330,754 uses transformer coupled field effect transistors driven by a pair of signals that are out-of-phase. Although possible, Hartley does not teach bias shifting. On the other hand, the bias shifting phenomenon is upset by the wide margins in the performance of field effect transistors.

The circuit in U.S. Pat. No. 4,439,742 by Sondermeyer is a transformer coupled pair of bipolar transistors that experience excessive bias shifting and to mitigate that unfortunate feature, additional input circuitry is included so that the behavior of this solid state circuit is more like that of vacuum tubes.

Although U.S. Pat. No. 4,987,381 by Butler, U.S. Pat. No. 4,811,401 by Brown, U.S. Pat. No. 4,405,832 by Sondermeyer shows capacitive coupling and shunt diodes, the shunt diodes are for the protection of the following amplifier and not bias shifting or the emulation of grid current. A similar structure of two diodes of opposite polarities shunting the input after capacitive coupling is shown in U.S. Pat. No. 4,899,115, however these are for compression effects. These arrangements can be dismissed since the symmetric use of diodes runs counter to the asymmetric diode structure of the grid conduction emulation. And all these references show the grid conduction for a single signal, not a signal pair.

The mutable audio amplifier of U.S. Pat. No. 4,041,408 by Trotnick contains the dual signal path that is capacitively coupled and has shunt diodes. However, the diodes are in the wrong direction to produce the presently desired bias shifting effects and does not emulate vacuum tube amplifiers.

The amplifier of U.S. Pat. No. 3,835,409 by Laub introduces the effect of the pair of bias shifting circuits and non-linear networks of the present invention but does so with a feedback system instead of the feed forward bias shifting approach.

OBJECTS OF THE INVENTION

The object of this invention is the combination of bias shifting and non-linear output circuits in solid stage devices which are transformerless coupled to produce an output that emulates the behavior of a vacuum tube amplifier.

Non-Linear Network Details

Figure 1:
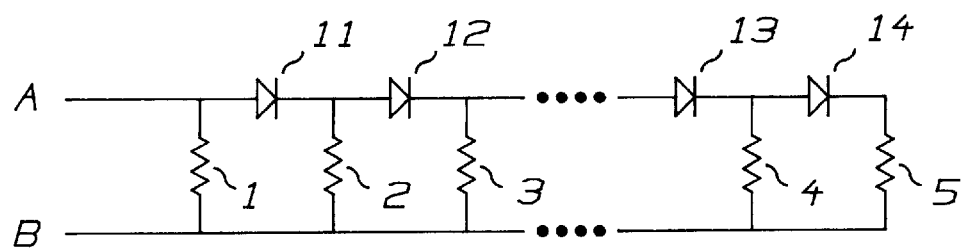
FIGS. 1–3 are schematics of various implementations of non-linear networks.

The resistor-diode network of FIG. 1 is described in U.S. Pat. No. 5,133,014 and incorporated herein by reference. It is a plurality of parallel resistors 1–5 series diodes 11–14. For input voltages across terminals A and B of less than one diode drop only resistor 1 conducts. For input voltages between one and two diode drops, resistors 1 and 2 conduct. Higher voltages make more resistors conduct, thereby lowering the dynamic resistance of the network.

Figure 2:
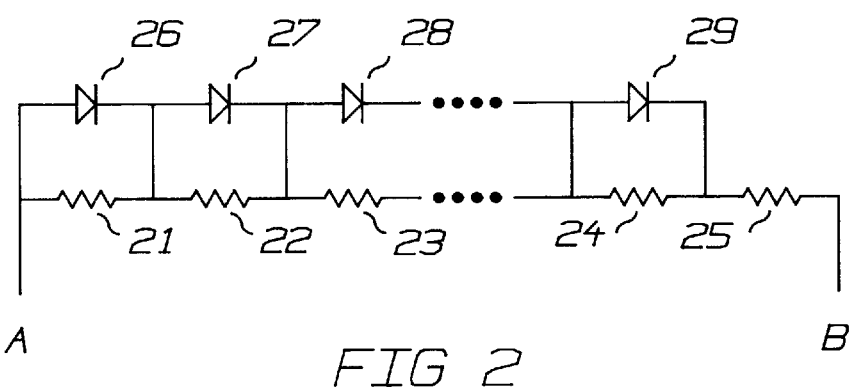

The resistor-diode network of FIG. 2 has a plurality of parallel resistor and diode pairs in series. As the current flowing from terminal A to B increases, the voltage across the resistors increases. When the resistor voltage approaches the diode drop, the diode conducts and dynamically removes the resistor from the series string. When all of the diodes conduct, the resistance of the network is the resistance of resistor 25.

There is a rough equivalency between these networks: Equal resistors in FIG. 1 produces a current approximately proportional to the square of the voltage across the terminals. Similarly, if the resistors of FIG. 2 are in the ratios of 1, 1/2, 1/6, 1/10, 1/15 ... and the last resistor, the nth, is 2/n, then it too produces a current approximately proportional to the square of the voltage across the terminals A and B.

It should be noted that the networks approximate the desired function over a region. The diodes tend to sectionalize the function and eventually all of the diodes are on and the network becomes linear.

Figure 3:
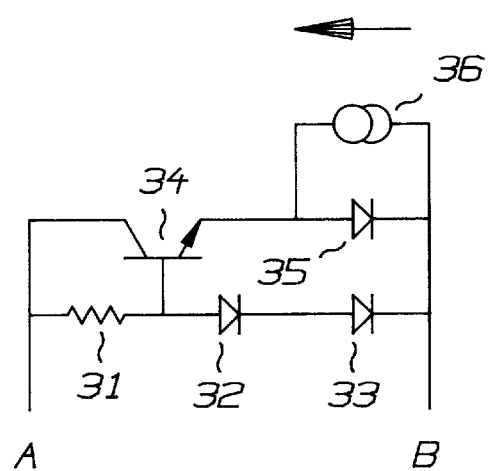

FIG. 3 also produces a squared current using semiconductor behavior found in logarithm amplifiers. The voltage across the terminals A and B is converted to a current by resistor 31. The current produces a voltage on the base of transistor 34 proportional to twice the logarithm of the current by diodes 32 and 33. The transistor 34 converts that voltage to a current in an exponential manner proportional to the square of the voltage across terminals A and B. This is made possible by biasing diode 35 with current source 36.

This non-linear circuit uses an active semiconductor, namely a transistor, to replace many passive semiconductors, diodes.

Figure 4:
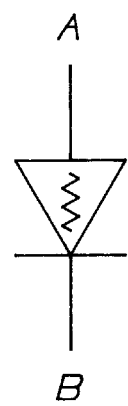
FIG. 4 is a symbol for non-linear networks.
Figure 5:
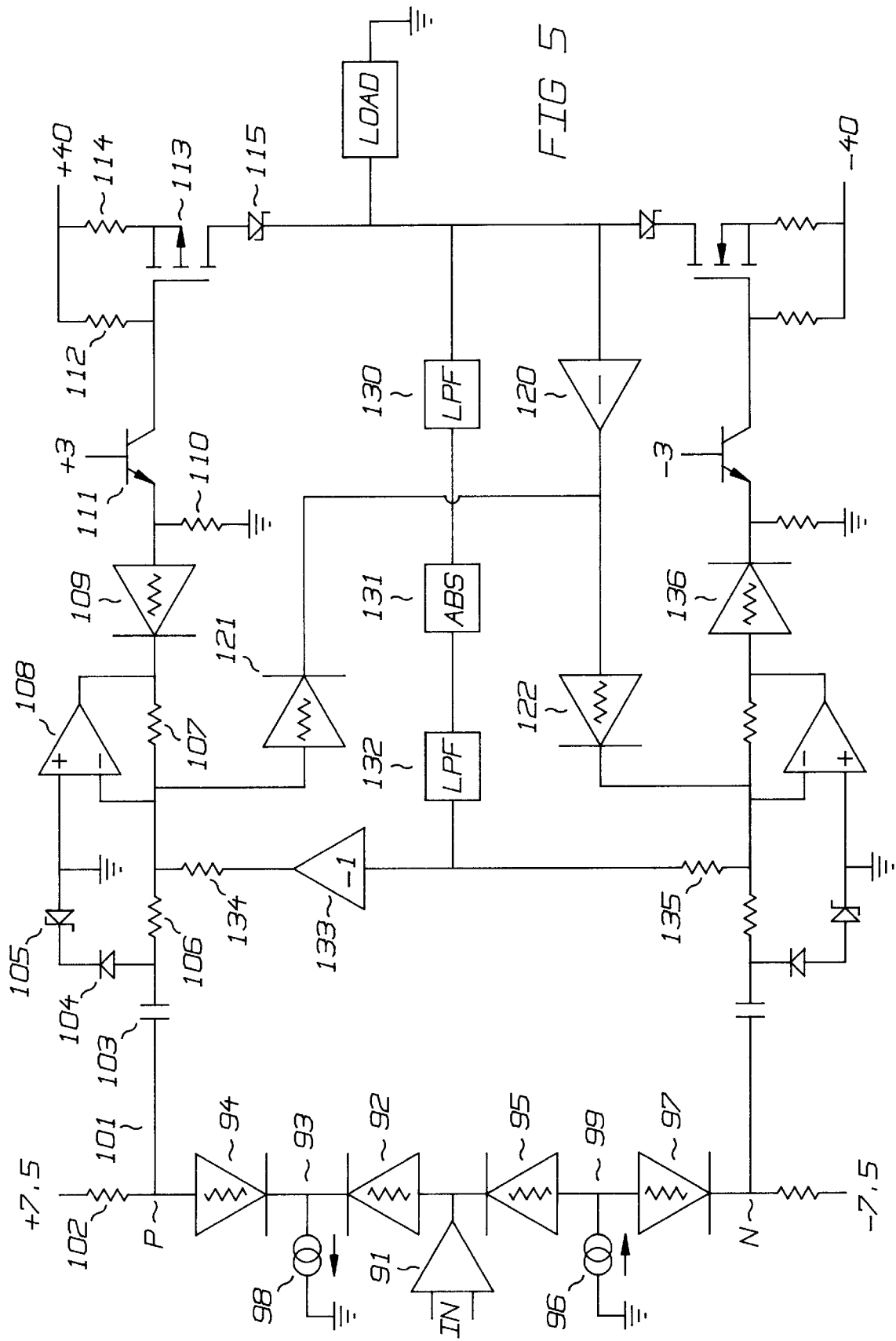
FIGS. 5–7 are schematics of semiconductor amplifiers.
Figure 6:
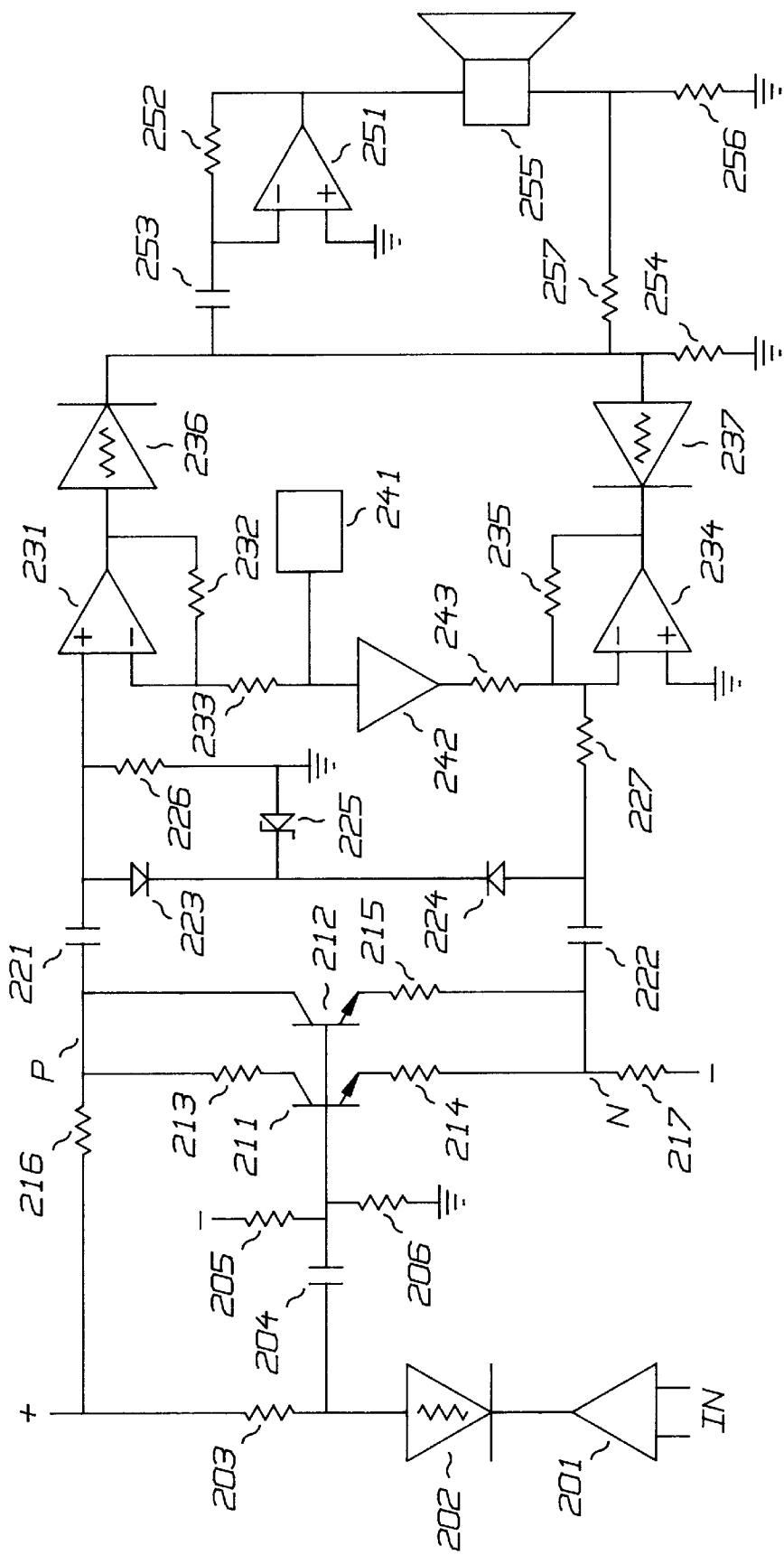
Figure 7:
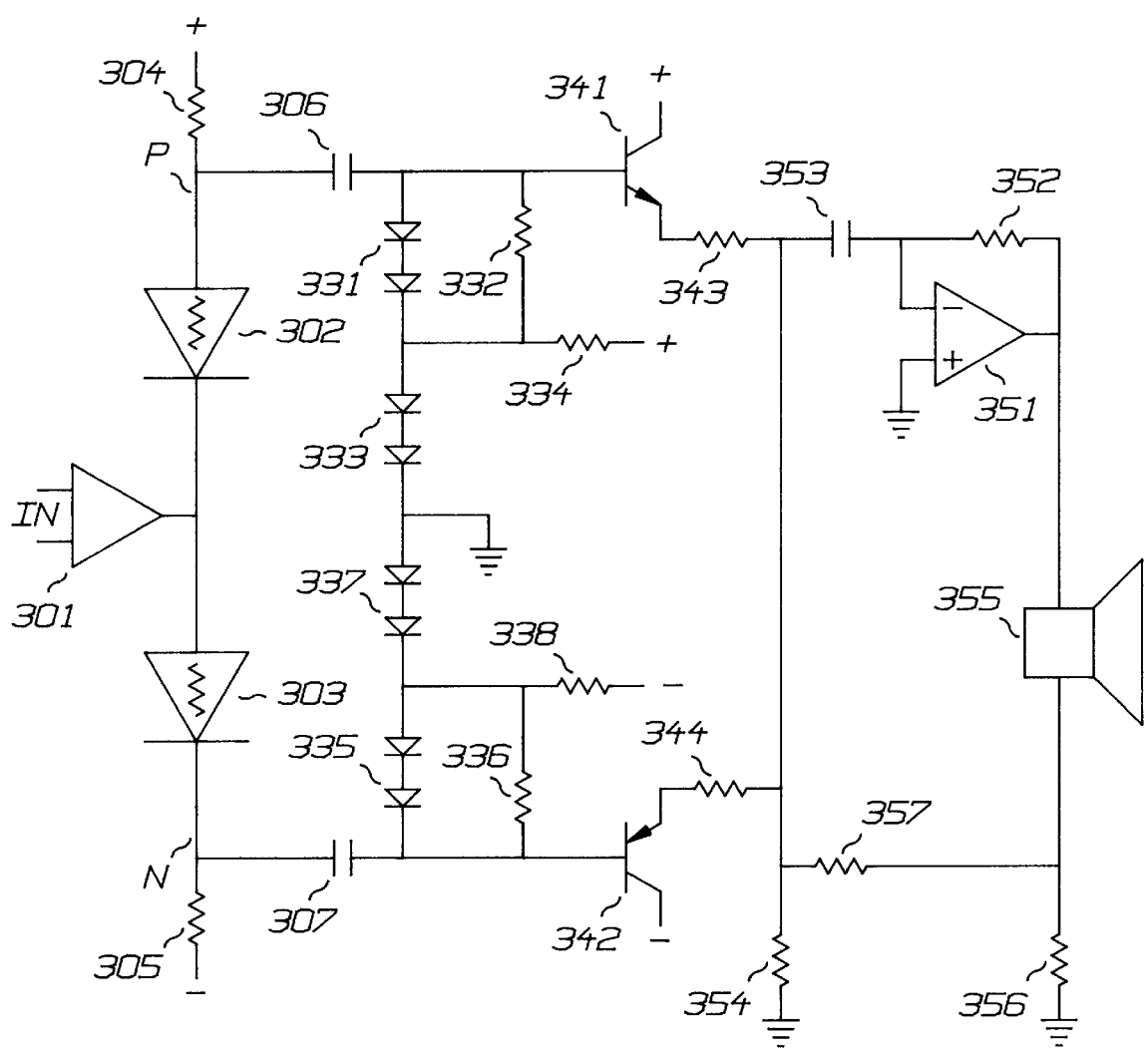

For brevity in the drawings, a new symbol shown in FIG. 4 will indicate a non-linear network as shown in FIGS. 5 through 7.

DESCRIPTION OF THE FIRST EMBODIMENT

The tube amplifier behavior is provided by the circuit shown in FIG. 5. It shows a complementary "phase splitter" and bipolar push-pull output which emulates push-pull pentodes with a poorly regulated power supply. FIG. 5 is a combination of FIGS. 10 and 11 of a preceding application, now U.S. Pat. No. 5,434,536.

The components 91 through 99 is an approximation to the phase splitter for a bipolar amplifier which requires both inputs in-phase. Since the two triodes in a differential amplifier phase splitter compensate each other, the stage produces very little distortion until clipping. The output resistance of the phase splitter is about twice the triode plate resistance normally, but becomes nearly infinite when clipping.

When the output of amplifier 91 goes high, network 92 pulls up voltage at 93. When the voltage at 93 approaches the plate voltage P, network 94 becomes more resistive and disconnects when the voltage at 93 is greater than the voltage at P. At the same time, network 95 disconnects and the current from source 96 flows through network 97 to plate N. Symmetric behavior occurs when the amplifier 91 output goes negative: network 92 disconnects, P has current from current source 98, network 95 pulls down voltage at 99, and network 97 disconnects from plate N. The networks 92, 94, 95, and 97 use an extra diode in series with the input to keep reverse currents from flowing.

The components 91–99 of FIG. 5 provides the soft cutoff for the grid circuit of the output stage. Since the negative half of the output stage operates symmetrically to the positive half, only the positive (upper) half will be detailed. As shown, the lower half operates in phase with the non-linearities in the opposite direction. Resistor 102 is the plate resistor for the input circuit. Capacitor 103 is the coupling capacitor. Diodes 104 and 105 emulate positive grid conduction. Zener diode 105 adjusts for the nominal zero bias of this stage. Resistor 106 is the grid resistor which drives amplifier 108 with feedback resistor 107. Network 109 is nominally a squaring, second order emulation of the pentode transfer characteristic. This gain varying characteristic provides smooth crossover and the variable gain for emulating tube compression. Amplifier 111, shown as a transistor, shifts the level of the signal to the output supply voltage +40 with the help of resistor 112. MOSFET 113 with source resistor transfers the voltage on resistor 112 to a current through resistor 114. Bias resistor 110 is adjusted to overcome the threshold voltage of MOSFET 113. The remaining bias is established by the voltage on the base of transistor 111. Zener diode 115 allows the load to fly back some before it is clamped.

The components 103–106 form a bias shifter. As explained in my earlier patents, such as U.S. Pat. No. 4,995,084 or 4,809,336 and obvious from the schematic, the grid conduction means, diodes 104–105, responds to large signals by conducting and charging the capacitor 103. The consequential charge offsets the signal.

Inverting amplifier 120 and non-linear networks 121 and 122 feedback the output to emulate the plate resistance of a pentode. Notice that the feedback loop goes through both non-linear networks. Consequently, the plate resistance and the transfer characteristics are functions of both the output and the input. This is seen in the different slopes of pentode plate curves.

The saturation region is emulated by resistor 114. Again, the entire characteristic is not perfect, but around the load line it is a good approximation.

The poor regulation of the power supply coupled with screen grid operation creates the compression found in tube amplifiers. When the power supply sags under the load of large signals, the screen voltage goes down in a manner dictated by the power supply filter. The drop in screen voltage lowers the output current and lowers the gain of the tube.

The screen grid voltage shift can be lumped into a control grid shift according to Thomas Martin in his book *Electronic Circuits,* Prentice-Hall, pages 84–87 providing the signal is scaled appropriately.

Although the power supply could drive this circuit, it is simpler to estimate the power current with filter 130. The resulting signal is rectified by 131 and then filtered by 132 which has the same time constants and overshoot as the emulated power supply. The output of 132 is fed to the negative half by resistor 135 while being inverted by 133 and fed to the positive half by resistor 134. An increasing output then reduces the bias on networks 109 and 136 reduces the output currents, increases the resistance of these networks and lowers the gain. The compression control signal from the output of filter 132 is canceled in the output.

Note that the grid conduction induced offset on the coupled P and N signals also reduces the bias on networks 109 and 136 and similarly reduces the output currents and gain. This changes the crossover characteristic to include a low gain, low current region.

FIG. 5 with FIGS. 1–4 clearly show that the polarities of the non-linear devices responsive to the P signal (104, 105, 109, 111, 113, 115, and 121) are complementary to the non-linear devices responsive to the N signal.

Description of Second Amplifier

The second amplifier has an input received by triode tube emulator created shown in part by amplifier 201 and non-linear means 202. The signal is formed in plate resistor 203 and coupled by capacitor 204. Resistors 205 and 206 bias the cathodyne phase splitter emulator which uses transistors 211 and 212. The emitter resistors set the current division between the two transistors and consequently the saturated tube current gain, ie. the ratio of resistor 214 to resistor 215, about 1 to 3. Resistor 213 represents the plate resistance and has a value of the desired plate resistance times the current gain plus one. The pair of out-of-phase signals are formed on resistors 216 and 217 which are the plate and cathode load resistors respectively. The P signal on resistor 216 is coupled by capacitor 221 while the N signal is coupled by 222. These signals then encounter the grid conduction emulation diodes 223–225. These capacitors charge the coupling capacitors when the P or N signals become too large and thereby shift the bias on the capacitors. The resistors 226 and 227 behave as grid resistors in tube amplifiers. Since these resistors have no bias, zener diode 225 must be included to raise the clipping point to a reasonable level. Operational amplifier 231 is a non-inverting stage with a gain being one plus the ratio of resistors 232 and 233. Operational amplifier 234 is an inverting stage with the gain being the ratio of resistors 235 and 227. These amplifiers drive complementary non-linear networks 236 and 237 with in-phase signals into a low impedance load formed by the next stage.

The bias for these non-linear networks may be set by a regulated power supply, but are preferably set by an unregulated supply 241 that has about two per cent ripple under minimum load conditions. The bias signal, which contains A.C. signals, drives amplifier 231 in an inverting manner while driving the inverting amplifier 234 via inverting amplifier 242. Thus, a bias signal makes both non-linear networks 236 and 237 conduct more or conduct less and thereby changing the gain. However, at zero input signal, the bias signal including the A.C. component is canceled. But the A.C. component of the bias modulates the input signals.

Balance is maintained by keeping the following relationships:

Resistors 226 and 227 are equal. The signal gains in amplifiers 231 and 234 are equal. The gain magnitudes in the bias paths 231–233 and 234, 235, 243, and 242 are equal.

The last stage uses an inverting power amplifier or power operational amplifier 251 that acts as a band-pass filter and emulates the frequency and output impedance of a tube amplifier. Resistor 254 and capacitor 253 combine to form a high-pass filter comparable to the saturation character of a transformer and makes the output look inductive at low frequencies. Resistor 254 and the gain-bandwidth product of the amplifier 251 forms a low-pass filter and makes the output look capacitive at high frequencies. Resistor 252 sets the mid-frequency gain. The amplifier 251 drives the speaker 255 whose current is sensed by resistor 256. The sense resistor is chosen to be equivalent to the saturation resistance of a tube amplifier at its output. The current feedback resistor is picked for an output impedance equivalent to the plate resistance at its output.

DESCRIPTION OF THE THIRD EMBODIMENT

The third embodiment has a similar structure, but trades simplicity for character. It has an input amplifier 301 which drives two non-linear networks or resistor means, 302 and 303, which have the character of a triode plate resistance. Since this system is in-phase, the networks and polarities are complementary. The P and N signals are formed on plate resistors 304 and 305 respectively. The P signal is coupled by capacitor 306 to grid conduction means 331 and amplifier means 341 which is simply an emitter follower. Symmetrically, the N signal is coupled by capacitor 307 to grid conduction means 335 and amplifier 342. These amplifiers are biased by power supply currents via resistors 334 and 338 which cause diodes 333 and 337 to conduct. The bias voltage is connected to the amplifiers by resistors 332 and 336. The outputs of the amplifiers are connected to the next stage via resistor means 343 and 344. The next stage is the same as in FIG. 6.

As the signal on the base of transistor 341 goes below one diode drop, the transistor stops conducting, loosely behaving like a tube. Also, as the signal on the base of transistor 342 goes above minus one diode drop, that transistor stops conducting. These transistors, like the non-linear networks 109, 136, 236, and 237 control the crossover character of the circuit.

The various non-linear means (92, 94, 95, 97, 109, 136, 202, 236, 237, 302, and 303) by their non-linear nature produce harmonics of the input signal whether the circuit is clipping or not.

These three embodiments share the same or similar topologies. Each has an input amplifier that generates the P and N signals. The P and N signals are capacitively coupled to a following grid conduction emulation means and to the next stage which includes a non-linear means for replicating the cut-off behavior of a tube. In all cases, the P and N non-linear transfer characteristic means, such as networks 109, 136, 236, and 237 and transistors 341 and 342, are in series with the signal.

Although the present invention has been described and illustrated in detail, it is to be clearly understood that the same is by way of illustration and example only, and is not to be taken by way of limitation. The spirit and scope of the present invention are to be limited only by terms of the appended claims:

1. A solid state audio amplifier for emulating the grid conduction of a push-pull vacuum tube amplifier, said solid state amplifier having an input and an output and comprising:
   an input circuit responsive to said input for producing a P signal and a N signal;
   a P coupling capacitor for coupling said P signal to a P grid conduction emulation means and to a P circuit which includes a P non-linear means for producing crossover;
   an N coupling capacitor for coupling said N signal to an N grid conduction emulation means and to an N circuit which includes an N non-linear means for producing crossover; and
   a transformerless connection means for connecting the outputs of said P circuit and said N circuit to said output.

2. The amplifier of claim 1 wherein said P and N signals are in-phase and wherein said P and N grid conduction emulation means are complementary.

3. The amplifier of claim 1 wherein said P and N signals are out-of-phase.

4. The amplifier of claim 1 wherein said P and N non-linear means are complementary.

5. The amplifier of claim 1 wherein said P and N circuits each include an operational amplifier.

6. The amplifier of claim 1 wherein said P and N circuits each include a transistor used as an emitter follower and said transistors are complementary.

7. The amplifier of claim 1 wherein said P and N non-linear means emulates the transfer characteristic of a vacuum tube.

8. The amplifier of claim 1 which includes plate non-linear means for emulating the plate resistance of vacuum tubes.

9. The amplifier of claim 8 wherein at least one of said P, N, or plate non-linear means draws a current approximately proportional to the square of the voltage across said non-linear means.

10. The amplifier of claim 8 wherein at least one of said P, N, or plate non-linear means includes series diodes and parallel resistors connected in a ladder.

11. The amplifier of claim 8 wherein at least one of said P, N, or plate non-linear means includes series connected pairs of a parallel resistor and diode.

12. The amplifier of claim 8 wherein at least one of said P, N, or plate non-linear means uses the logarithmic and exponential characteristics of semiconductor junctions to produce a non-linear relationship between the voltage across said non-linear means to the current flowing through said non-linear means.

13. The amplifier of claim 1 wherein said input circuit includes at least one resistor in series with at least one of said P coupling capacitor or said N coupling capacitor.

14. The amplifier of claim 1 wherein said P coupling capacitor and P grid conduction emulation means are part of a P bias shifter which serves to charge said P coupling capacitor if said P signal causes said P grid conduction means to conduct; and wherein said N coupling capacitor and N grid conduction emulation means are part of an N bias shifter which serves to charge said N coupling capacitor if said N signal causes said N grid conduction means to conduct.

15. The amplifier of claim 1 wherein said transformerless coupling means includes power amplifier means responsive to said P circuit and said N circuit for producing said output.

16. The amplifier of claim 15 wherein said power amplifier has an output impedance which is inductive at low frequencies and capacitive at high frequencies.

17. The amplifier of claim 1 which includes a signal means for modulating said output.

18. The amplifier of claim 1 which includes bias means for biasing said P and N non-linear means.

19. The amplifier of claim 1 wherein said N and P non-linear means is in series with the P and N signal respectively.

20. A solid state amplifier for emulating the effects of grid current in a vacuum tube amplifier, said amplifier means having an input and an output comprising:
   an input amplifier for receiving said input and producing a P signal and N signal;
   a first solid state device responsive to said P signal including a P coupling capacitor connected between said input amplifier and a P grid conduction means for providing a coupled P signal, and a P amplifier responsive to said coupled P signal;
   a second solid state device responsive to said N signal including a N coupling capacitor connected between said input amplifier and a N grid conduction means for providing a coupled N signal, and a N amplifier responsive to said coupled N signal;

a P non-linear means connected to said P amplifier and said output; and a N non-linear means connected to said N amplifier and said output, wherein said P and N non-linear means are complementary and produce crossover.

21. The amplifier of claim 20 wherein at least one of said P and N amplifiers are also responsive to non-linear feedback.

22. The amplifier of claim 20 which includes means for the emulation of the plate resistance of a vacuum tube.

23. The amplifier of claim 20 wherein said P and N non-linear means emulate the transfer characteristic of a vacuum tube.

24. The amplifier of claim 20 which includes a signal means for modulating said output.

25. A solid state audio amplifier for emulating the effects of grid current in a vacuum tube amplifier, said amplifier means having an input and an output comprising:

an input amplifier for receiving said input and producing a P signal and N signal;

a P solid state device responsive to said P signal including a P coupling capacitor connected between said input amplifier and a P grid conduction means for providing a coupled P signal, a P amplifier responsive to said coupled P signal, and a P non-linear device responsive to said P amplifier;

a N solid state device responsive to said N signal including a N coupling capacitor connected between said input amplifier and a N grid conduction means for providing a coupled N signal, a N amplifier responsive to said coupled N signal, and a N non-linear device responsive to said N amplifier;

an output amplifier responsive to said P non-linear device and to said N non-linear device for producing said output, wherein said P and N non-linear means are complementary and produce crossover.

26. The solid state audio amplifier of claim 25 wherein said output amplifier means has an output impedance which appears inductive at low audio frequencies and capacitive at high audio frequencies.

27. The solid state audio amplifier of claim 25 which includes a plate non-linear means for emulating the plate resistance of a vacuum tube.

28. The solid state audio amplifier of claim 25 which includes transfer non-linear means for emulating the transfer characteristic of a vacuum tube.

29. The solid state audio amplifier of claim 28 which includes compression means for lowering the gain of said solid state audio amplifier in response to an increased output.

30. The solid state audio amplifier of claim 28 which includes a signal means for modulating said output.

31. The solid state audio amplifier of claim 25 wherein said input amplifier includes means for the emulation of cathodyne phase splitter.

32. The solid state audio amplifier of claim 25 which includes means for biasing at least one of said P and N non-linear devices.

33. The solid state audio amplifier of claim 25 wherein said input amplifier includes at least one resistor in series with at least one of said P coupling capacitor or said N coupling capacitor.

34. The solid state audio amplifier of claim 25 which includes non-linear means for producing harmonics whether clipping or not.

* * * * *